United States Patent
Takahashi et al.

(10) Patent No.: US 6,372,337 B2
(45) Date of Patent: *Apr. 16, 2002

(54) THERMALLY CONDUCTIVE GREASE COMPOSITION AND SEMICONDUCTOR DEVICE USING THE SAME

(75) Inventors: Takayuki Takahashi; Kunihiro Yamada; Kenichi Isobe, all of Gunma-ken (JP)

(73) Assignee: Shin-Etsu Chemical Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,736

(22) Filed: May 26, 1999

(30) Foreign Application Priority Data

Aug. 21, 1998 (JP) .............................. 10-235731

(51) Int. Cl.⁷ .............................. B32B 5/16; H01B 1/22; H01L 21/4763; C08K 3/08
(52) U.S. Cl. .................. 428/328; 428/323; 428/332; 428/402; 428/403; 252/512; 438/584; 524/441; 524/786; 508/172
(58) Field of Search ................. 252/512; 438/584; 428/323, 328, 411.1, 421, 447, 500, 515, 220, 332, 402, 403; 524/439, 441, 786; 508/172

(56) References Cited

U.S. PATENT DOCUMENTS

| | | | | |
|---|---|---|---|---|
| 3,117,085 A | * | 1/1964 | Rees et al. ................. | 508/144 |
| 4,659,613 A | * | 4/1987 | Mosser et al. ............... | 428/215 |
| 5,011,870 A | * | 4/1991 | Peterson ..................... | 523/220 |
| 5,094,769 A | * | 3/1992 | Anderson, Jr. et al. ....... | 252/71 |
| 5,098,609 A | * | 3/1992 | Iruvanti et al. ............. | 252/511 |
| 5,317,061 A | * | 5/1994 | Chu et al. ................... | 525/200 |
| 5,411,077 A | * | 5/1995 | Tousignant ............ | 165/104.33 |
| 5,510,174 A | * | 4/1996 | Litman ........................ | 442/151 |
| 5,730,803 A | * | 3/1998 | Steger et al. ........... | 118/723 R |
| 5,945,217 A | * | 8/1999 | Hanrahan .................... | 428/389 |
| 5,981,641 A | * | 11/1999 | Takahashi et al. ........... | 524/428 |
| 6,037,658 A | * | 3/2000 | Brodsky et al. ............. | 257/707 |
| 6,090,879 A | * | 7/2000 | Takuman et al. ............ | 524/437 |

FOREIGN PATENT DOCUMENTS

| | | |
|---|---|---|
| EP | 0 696 630 | 2/1996 |
| EP | 0 939 115 | 9/1999 |
| JP | 08145210 | * 11/1997 |

* cited by examiner

Primary Examiner—Stevan A. Resan
Assistant Examiner—Kevin M. Bernatz
(74) Attorney, Agent, or Firm—Millen, White, Zelano & Branigan, P.C.

(57) ABSTRACT

A grease composition having high thermal conductivity and excellent dispensation suitability, comprising (A) 100 parts by weight of a base oil and (B) 500 to 1,200 parts by weight of metallic aluminum powder having the average particle size in the range of 0.5–50 μm; wherein the aluminum powder is a mixture of fine metallic aluminum powder having an average size of 0.5 to 5 μm and coarse metallic aluminum powder having an average particle size of 10 to 40 μm; and a semiconductor device utilizing the aforesaid grease composition.

16 Claims, 1 Drawing Sheet

THERMALLY CONDUCTIVE GREASE COMPOSITION AND SEMICONDUCTOR DEVICE USING THE SAME

FIELD OF THE INVENTION

The present invention relates to a thermally conductive material and, more particularly, to a grease composition having high thermal conductivity which enables effective dissipation of the heat from electronic parts, and further to a semiconductor device in which the aforesaid thermally conductive grease composition is utilized to effectively remove the heat from electronic parts as a device member, thereby preventing the electronic parts from suffering a serious drop in performance and causing damage due to a rise in their temperature.

BACKGROUND OF THE INVENTION

Most of electronic parts generate heat while they are used, so that the removal of the generated heat therefrom is necessary for their normal operation. With the intention of removing the heat generated from electronic parts, many means have been proposed. In miniature electronic parts, especially electronic devices provided with integrated circuit elements, thermally conductive materials, such as a thermally conductive grease and a thermally conductive sheet, have been employed as heat removing means (Japanese Tokkai Sho 56-28264 and Japanese Tokkai Sho 61-157587, wherein the term "Tokkai" means an "unexamined published patent application").

In general, an electronic device comprises integrated circuit elements and cap parts for protecting them, and further a thermally conductive material is applied thereto so as to contact directly with both the circuit element and the heat dissipating part, or indirectly therewith via certain materials (See FIG. 1). Accordingly, the heat generated from integrated circuit chips during operation is transmitted to the thermally conductive material and then transferred directly or indirectly to the heat dissipating part, followed by heat release from the heat dissipating part.

With respect to the thermally conductive materials as mentioned above, heat-reducing grease of the type which uses a silicone oil as a base material and a zinc oxide or alumina powder as a thickener is already known (Japanese Tokko Sho 52-33272 and Japanese Tokko Sho 59-52195, wherein the term "Tokko" means an "examined patent publication"). In recent years, aluminum nitride has been developed as a thickener which enables further improvement of thermal conductivity (as disclosed, e.g., in Japanese Tokkai Sho 52-125506).

However, the permissible content of aluminum nitride in a silicone oil used as base oil is restricted within very narrow limits, or to the order of 50–95 weight parts per 100 weight parts of the silicone oil, due to its insufficient oil-holding power, so that the resulting grease composition undergoes no great improvement in thermal conductivity by the use of aluminum nitride instead of other known thickeners though the aluminum nitride itself has high thermal conductivity.

In Japanese Tokkai Sho 56-28264 is disclosed the thermally conductive thixotropic material comprising a liquid organosilicone carrier, silica fiber in an effective amount for prevention of the liquid carrier exudation, and a thermal conductivity-providing powder selected from a group consisting of dendrite-form zinc oxide, thin-leaf aluminum nitride, thin-leaf boron nitride and a mixture of two or more thereof. From this material also, sufficient improvement of thermal conductivity cannot be expected because it is inevitable to reduce the aluminum nitride powder content due to the incorporation of spherical silica fiber as an essential component for enhancement of oil-holding power.

This drawback can be mitigated by using a combination of a particular organopolysiloxane with a spherical aluminum nitride powder having a hexagonal crystal form and grain sizes in a specified range to enable a very large amount of aluminum nitride to be incorporated in the silicone oil (Japanese Tokkai Hei 2-153995). However, aluminum nitride is a very hard material having Mohs hardness of from 7 to 9, and so there are spaces between aluminum nitride grains when they are coarse grains. Therefore, the effect produced by such an increase of the aluminum nitride powder content upon improvement of thermal conductivity is smaller than expected. More specifically, the thermal conductivity attained is of the order of 2.3 W/mK, which is still unsatisfactory.

As a measure to solve this problem, the combined use of fine and coarse aluminum nitride powders has been proposed (Japanese Tokkai Hei 3-14873). While the thermal conductivity is elevated in this case, the resulting composition is too small in consistency (too hard) as grease and has poor dispensation suitability; as a result, it is unsuitable for practical use.

Further, there are proposals such that organopolysiloxanes of the kind which can hold inorganic fillers in large amounts are employed as base oil and they are combined with at least one inorganic filler selected from the group consisting of ZnO, $Al_2O_3$, AlN and $Si_3N_4$ (e.g., Japanese Tokkai Hei 2-212556 and Japanese Tokkai Hei 3-162493). However, those combinations are still unsuccessful in attaining a satisfactory level of heat-reducing grease.

The Inventors have already developed a thermally conductive composition utilizing the combination of an aluminum nitride powder with a zinc oxide powder to acquire high thermal conductivity and excellent dispensation suitability, and applied for a patent. Nowadays, however, there is an increasing demand for compositions having higher thermal conductivity than such a composition.

In recent years, on the other hand, electronic devices comprised of unsealed silicon chips have been employed. In a case where a thermally conductive composition utilizing an aluminum nitride powder as a hard filler is applied to the silicon surface of such chips, it has turned out that the hard filler impairs the silicon surface to cause troubles. Such being the case, the demand for compositions causing no damage to the silicon surface has been created lately.

SUMMARY OF THE INVENTION

As a result of our intensive studies of thermally conductive compositions having further improved dispensation suitability and thermal conductivity and causing no damage to the surface of silicon chips, it has been found that good results can be obtained by combining a particular base oil with a metallic aluminum powder having an average particle size in the range of 0.5–50 µm, thereby achieving the present invention.

Therefore, a first object of the present invention is to provide a thermally conductive soft grease composition having high thermal conductivity, excellent dispensation suitability and no fear of causing damage to the silicon surface.

A second object of the present invention is to provide a high-performance semiconductor device which is prevented from suffering the overheating of heat-generating electronic parts.

The above-described objects of the present invention are attained with a thermally conductive grease composition comprising (A) 100 parts by weight of a base oil and (B) 500 to 1,200 parts by weight of metallic aluminum powder having the average particle size in the range of 0.5–50 μm, and a semiconductor device utilizing the aforesaid grease composition.

In accordance with the present invention, the grease composition obtained has high thermal conductivity and can be safely applied to a delicate semiconductor material without damaging the surface of the material on contact therewith, because the inorganic filler used can ensure softness in the grease composition. Further, when the present thermally conductive grease composition is applied to heat-generating electronic parts having uncovered silicon surfaces, the resulting semiconductor devices can acquire especially excellent heat-dissipating properties.

DETAILED DESCRIPTION OF THE INVENTION

Figure 1:
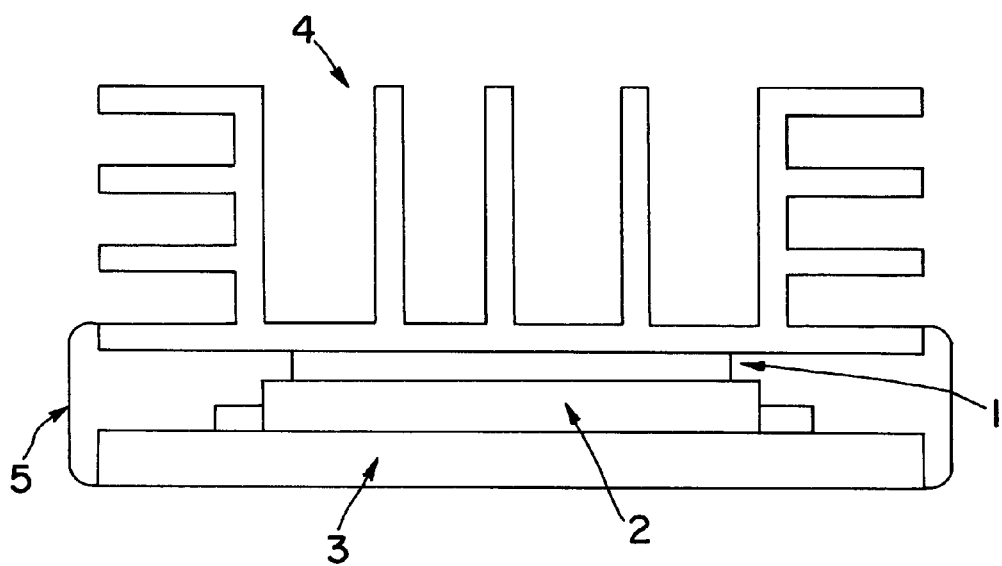
FIG. 1 shows an embodiment of the present semiconductor device wherein heat-generating electronic parts (with uncovered silicon surface), such as an integrated circuit element, and a heat dissipator are laminated via the present thermally conductive grease. Therein, the figure 1 denotes thermally conductive grease, the figure 2 denotes heat-generating electronic parts (semiconductor elements and the package thereof), the figure 3 denotes a printed circuit substrate, the figure denotes a heat dissipator, and the figure denotes clamps.

It is required for base oils used in the present invention to have the following characteristics:
1) appropriate viscosity characteristics, including a slight change of viscosity with temperature and solidification at a low temperature (a low pour point),
2) low volatility at high temperatures and a high flash point,
3) high stability against oxidation and satisfactory thermal stability, more specifically good receptiveness to the benefit from antioxidants and no changes in color and properties upon heating up to about 200° C.,
4) good oiliness,
5) almost no bad influences upon surrounding materials, more specifically no deteriorating action upon a sealing material, a resinous or ceramic cover or the like, and
6) good affinity for fillers (thickeners).

Of the base oils having the foregoing characteristics, mineral oils generally used as base oil of lubricating oil, such as naphthene oil and paraffin oil, are usable in the present invention. In particular, synthetic silicone oils, such as silicone oils containing methyl groups and those containing phenyl groups, are suitable for the base oil of grease or the like which is used under temperatures covering a wide range. Further, synthetic oils like fluorinated hydrocarbon oils can also be used as the base oil because of their superiorities in fluidity, viscosity index and thermal stability to mineral oils.

The liquid silicone as the base oil usable in the present invention can be properly selected from known silicones which are liquid at room temperature, such as organopolysiloxanes, polyorganosilalkylenes, polyorganosilanes and copolymers thereof. However, the use of organopolysiloxanes is advantageous from the viewpoint of ensuring heat resistance, stability and electric insulation. In particular, organopolysiloxanes represented by compositional formula $R^1_a SiO_{(4-a)/2}$ are preferred over the others. Each $R^1$ in that formula is a hydrogen atom, a hydroxyl group or a group selected from monovalent organic groups, and all $R^1$ groups may be the same or different.

Examples of a monovalent organic group as $R^1$ include unsubstituted or substituted monovalent hydrocarbon groups containing 1 to 30 carbon atoms, such as alkyl groups (e.g., methyl, ethyl, propyl, butyl, pentyl, hexyl, octyl, decyl, dodecyl, tetradecyl, hexadecyl and octadecyl); cycloalkyl groups (e.g., cyclohexyl); alkenyl groups (e.g., vinyl and allyl); aryl groups(e.g., phenyl, naphthyl and tolyl) and groups formed by substituting halogen atom(s), cyano group (s), hydroxyl group(s) or/and so on for part or all of the hydrogen atoms attached to carbon atoms present in the above-recited groups (e.g., chloromethyl, 3,3,3-trifluoropropyl, cyano-propyl, phenol and hindered phenol groups); and amino group-containing hydrocarbon groups, polyether group-containing hydrocarbon groups and epoxy group-containing hydrocarbon groups. Of these groups, a methyl group, a phenyl and an alkyl groups having 6 to 14 carbon atoms are. preferred over the others in the present invention. Further, "a" in the above formula is a number of 1.8–2.3.

For acquiring satisfactory grease characteristics, it is desirable that the viscosity of the foregoing organopolysiloxanes be from 50 to 500,000 cs, particularly from 50 to 300,000 cs, at 25° C. When the viscosity is below 50 cs at 25° C., the grease obtained shows a strong tendency to oil separation; while, when it is above 500,000 cs at 25° C., the grease prepared is so high in viscosity that it is considerably inferior in dispensation suitability to a substrate.

Those organopolysiloxanes as mentioned above can have any of linear, branched and cyclic structures. In using them as base oil, they are not necessarily used alone, but may be used as a mixture of two or more of them. Although "a" is from 1.8 to 2.3, it is preferable for the organopolysiloxane to have "a" in the range of 1.9 to 2.1 as this range enables the organopolysiloxane to have a linear structure or a structure close thereto.

Suitable examples of such an organopolysiloxane include dimethylpolysiloxane, diethylpolysiloxane, methyl-phenylpolysiloxane, dimethylsiloxane-diphenylsiloxane copolymer, and alkyl-modified methylpolysiloxanes. In particular, homopolymers and copolymers constituted of dimethylsiloxane units, alkylmethylsiloxane units, methylphenylsiloxane units or/and diphenylsiloxane units, and that blocked at their molecular-chain ends with trimethylsilyl or dimethylhydrosilyl groups, are preferred over the others.

More specifically, such organopolysiloxanes are represented by, e.g., the following formula (I):

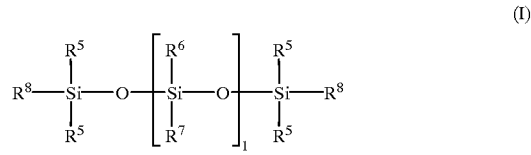

(I)

wherein each of $R^5$ groups is a group selected from monovalent unsubstituted or substituted hydrocarbon groups having 1 to 30 carbon atoms, such as alkyl groups (e.g., methyl, ethyl, propyl, butyl, amyl, octyl, etc.), alkenyl groups (e.g., vinyl, allyl, etc.), aryl groups (e.g., phenyl, tolyl, etc.) and groups formed by substituting halogen atom(s), cyano group (s), hydroxyl group(s) or/and so on for part or all of the hydrogen atoms attached to carbon atoms present in the above-recited groups (e.g., chloromethyl, 3,3,3-trifluoropropyl, cyanopropyl, phenol, hindered phenol, etc.); $R^6$ and $R^7$ groups are the same or different, and each of them is the same monovalent hydrocarbon group as $R^5$ represents, an amino group-containing hydrocarbon group, a polyether group-containing hydrocarbon group or an epoxy group-containing hydrocarbon group; $R^8$ is a hydrogen atom, a hydroxyl group, the same monovalent hydrocarbon group as $R^5$ represents., or the same monovalent hydrocarbon group as $R^6$ or $R^7$ represents; and l is a positive number to ensure the viscosity of from 50 to 500,000 cs at 25° C. in the organopolysiloxane.

It is desirable for the organopolysiloxane used in the present invention to be blocked with trimethylsilyl groups at the molecular-chain ends thereof. As $R^5$, $R^6$ and $R^7$ each, an alkyl group such as methyl or ethyl, an aryl group such as phenyl or tolyl, or a group formed by substituting hydroxyl group(s) for a part of the hydrogen atoms of the group as recited above, particularly a methyl group, a phenyl group or an alkyl group having 6 to 14 carbon atoms, is preferable with respect to easiness of synthesis and thermal resistance and electric insulation of the oil obtained.

However, these organopolysiloxane oils generally contain low molecular weight siloxanes having at most 12 siloxane units in a proportion of about 10%, because they are obtained as an equilibrated mixture of polysiloxanes having different polymerization degrees which are produced with the progress of polymerization. Therefore, such low molecular weight siloxanes are generally removed from the synthesis products by stripping treatment at a temperature of 120–250° C. under a reduced pressure.

Even after the stripping treatment, however, the low molecular weight siloxanes still remain in a quantity of 500–20,000 ppm. These low molecular weight siloxanes have a strong adsorbing power, compared with nonpolar combustible gases, so that their vapors are adsorbed strongly by various electrical contact parts and so on. The low molecular weight siloxanes adsorbed to electrical contact parts are converted into $SiO_2 \cdot nH_2O$ by undergoing oxidation, and further accumulated in the form of $\alpha SiO_2$ on the surface of the contact parts to cause a contact point disturbance. Therefore, the presence of low molecular weight siloxanes in organopolysiloxane oil is already known to be undesirable.

In addition, it is also known that such a trouble can be prevented by reducing each of the contents of low molecular weight siloxanes having no more than 12 siloxane units to at most 50 ppm.

The removal of the foregoing low molecular weight siloxanes can be effected by subjecting the organopolysiloxane oil product to a stripping treatment at a high temperature of 150–300° C. under a reduced pressure of 50 mmHg or below in an atmosphere of dried nitrogen gas, or by extracting the low molecular weight siloxanes contained in the organopolysiloxane oil product with an alcohol or ketone solvent. Thus, each of the contents of low molecular weight siloxanes in the organopolysiloxane oil product can be reduced to less than 50 ppm, and the total content of the low molecular weight siloxanes having from 2 to 12 siloxane units can be reduced to less than 500 ppm.

The organopolysiloxane oil product as mentioned above so can be obtained using hitherto known methods. For instance, dimethylpolysiloxane oil can be produced by subjecting a low molecular cyclic siloxane, such as octamethylcyclotetrasiloxane or decamethylcyclopentasiloxane, to a ring-opening reaction in the presence of an acid catalyst, such as sulfuric acid, chlorosulfonic acid, nitric acid, phosphoric acid, activated clay, acid clay or trifluoroacetic acid, or an alkaline catalyst, such as potassium hydroxide, sodium hydroxide, rubidium hydroxide, cesium hydroxide, potassium oxide, potassium acetate or calcium silanolate, and then polymerizing the reaction product.

In order to produce a dimethylpolysiloxane oil having the intended viscosity by controlling the polymerization degree in the foregoing method, a low molecular weight siloxane having a terminal blocking group, such as hexamethyldisiloxane, octamethyltrisiloxane or decamethyl-tetrasiloxane, can be added properly at the stage of polymerization.

As for the production of organopolysiloxanes having functional groups, on the other hand, the amino group-containing organopolysiloxanes can be produced by the dealcoholating condensation reaction between organopolysiloxanes having at least one silanol group and amino group-containing alkoxysilanes, and the epoxy group- or polyether group-containing organopolysiloxanes can be produced by the addition reaction between compounds having both an epoxy or polyether group and an unsaturated group, such as vinyl group, in the same molecule and organohydrogenpolysiloxanes having hydrogen-attached silicon atom (s) in the presence of a platinum catalyst.

From the standpoint of improving, e.g., the thermal resistance, $R^5$ in formula (I) may be a monovalent substituted hydrocarbon group having the hindered phenol structure as described in Japanese Tokko Hei 3-131692. Specific examples of an organopolysiloxane having such $R^5$ groups include organopolysiloxanes represented by the following formula (II), but these examples should not be construed as limiting on the scope of the present invention anyway:

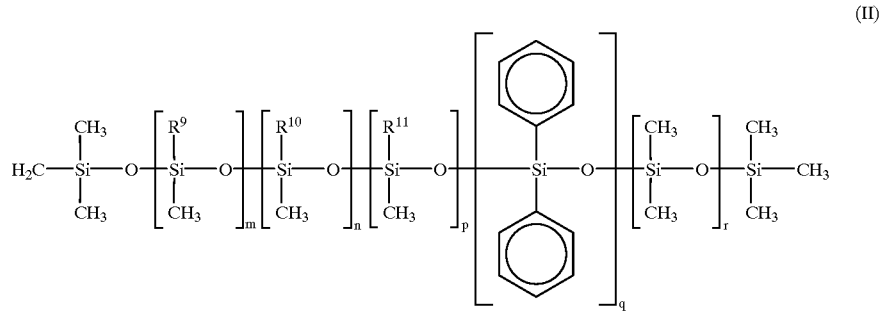

(II)

wherein $R^9$ is —$C_4H_9$, —$C_6H_{13}$, —$C_8H_{17}$, —$C_{10}H_{21}$, —$C_{12}H_{25}$, —$C_{15}H_{31}$ or —$C_{18}H_{37}$; $R^{10}$ is —$(CH_2)_s$—Q; s is an integer of 1 to 6; Q is a group selected from the following monovalent organic groups having hindered phenol structures,

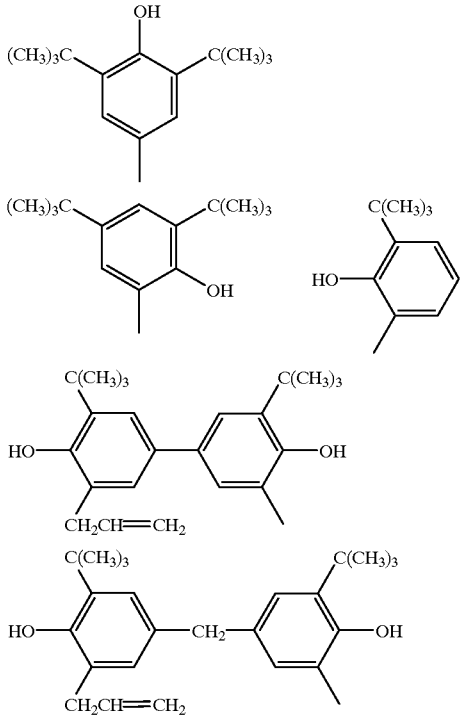

$R^{11}$ is a 2-phenylethyl group or a 2-phenyipropyl group; and m, n, p, q and r are each a number satisfying the following equations: $0 \leq m \leq 1,000$, $0 \leq n \leq 100$, $0 \leq p \leq 1,000$, $0 \leq q \leq 1,000$, $0 \leq r \leq 2,000$ and $5 \leq m+n+p+q+r \leq 2,000$.

From the viewpoint of consistency and dispensation suitability required for a silicone grease composition, it is desirable that the liquid silicone used in the present invention have its viscosity in the range of 50 to 500,000 cs, particularly 50 to 300,000 cs, at 25° C.

Examples of mineral oil and synthetic oil usable as base oil in the present invention include paraffin oil, naphthene oil, α-olefin oligomers (poly-α-olefins), polybutenes (polyisobutylenes), alkylbenzenes, polyalkylene glycols (polyglycol, polyether, polyalkylene oxides), diesters (dibasic acid esters), polyol esters (neopentylpolyol esters and hindered esters), phosphoric acid esters (phosphate esters), fluorinated compounds, such as chlorofluorocarbons, fluoroesters and perfluoroalkyl ethers (fluoropolyglycols, perfluoropolyethers, polyperfluoroalkylethers), and polyphenyl ethers.

With respect to the synthetic oils recited above, the α-olefin oligomers include those represented by the following formula (III), the polybutenes include those represented by the following formula (IV), the alkylbenzenes include those represented by the following formula (V), and the polyalkylene glycols include those represented by the following formula (VI):

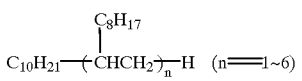 (III)

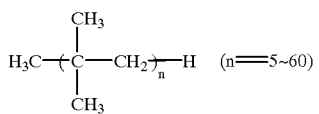 (IV)

 (V)

R, R': $C_{10-18}$ alkyl

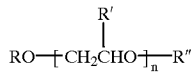 (VI)

In the above formula (VI), R and R" are each a hydrogen atom or a $C_{1-20}$ alkyl group, R' is H or $CH_3$, and n is from 5 to 100. In general, the polyalkylene glycol of formula (VI) is polyethylene or polypropylene glycol having hydrogen atoms or methyl groups as R and R". Further, it may be a copolymer of these two glycols.

The diesters (dibasic acid esters) are generally produced by the esterification reaction between alcohols and dibasic acids as shown below;

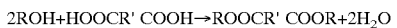

wherein R is H or a $C_{4-18}$ alkyl group and R' is a $C_{4-18}$ alkylene group or an arylene group.

The dibasic acids used as starting material are generally those represented by formula, $HOOC(CH_2)_nCOOH$, with examples including adipic acid (n=4), azelaic acid (n=7), sebacic acid (n=8) and dodecane, diacid (n=10). The alcohols used in combination with those acids are $C_{7-13}$ primary alcohols having a side chain, with examples including 2-ethylhexanol ($C_8$), isodecanol ($C_{10}$) and tridecanol ($C_{13}$).

By using those acids and alcohols in different combinations, various diesters can be obtained. Examples of such a diester include diisodecyl phthalate, di-2-ethylhexyl phthalate, dibutyl phthalate, diisodecyl adipate, diisononyl adipate, diisobutyl adipate, mixed acid esters of 2-ethylhexanol, di-2-hexyl sebacate, dibutyl sebacate, di-2-ethylhexyl azelate, di-n-hexyl azelate, di-2-hexyl dodecanoate and dibutoxyethoxyethyl adipate.

The polyol esters, including neopentylpolyol esters and hindered esters, are monobasic fatty acid esters of polyhydric alcohols, such as neopentylpolyols.

In producing polyol esters, neopentylpolyols which are mass-produced as the starting material for syntheses of alkyd resin and surfactants can be employed as raw materials of polyhydric alcohols. Specifically, neopentyl glycol (NPG), trimethylolpropane (TMP), trimethylolethane (TME), pentaerithritol (PE) and dipentaerithritol (DPE) can be used as neopentylpolyols.

The monobasic fatty acids usable as the other starting material in the polyol ester synthesis include straight-chain and branched $C_{3-13}$ carboxylic acids. For instance, as $C_9$ carboxylic acids are exemplified the following acids having a straight-chain structure, a branched structure and a structure having a neopentyl type of branch respectively:

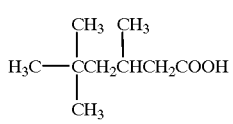 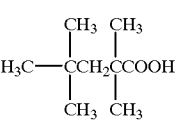

By variously combining the above-recited compounds as starting materials, a wide variety of polyol esters can be synthesized. In particular, the esters produced by the reaction of an acid having a branch of neopentyl type with an alcohol having a branch of neopentyl type have the advantage of high thermal stability.

Additionally, by the comparative experiment on stability against pyrolysis between di(isooctyl)azelate as an ester produced from an alcohol having no branch of neopentyl type and an acid having no branch of neopentyl type, bis(2,2-dimethyloctyl) azelate as an ester produced from an alcohol having a branch of neopentyl type and an acid having no branch of neopentyl type, and bis(2,2-dimethylpentyl)-2,2,8,8-tetra-ethylazelate as an ester produced from an alcohol having a branch of neopentyl type and an acid having branches of neopentyl type, it is known that the last ester as the neopentyl type-neopentyl type combination has the highest thermal stability.

The phosphoric acid esters include esters prepared from phosphoric acid as an -inorganic acid and phenols or alcohols. With respect to the phenyl phosphate, as triphenyl phosphate is in a solid state at ordinary temperature, the phenyl phosphates in a liquid state can be generally prepared by using phenols having alkyl substituent(s). Examples of such a liquid phenyl phosphate include tricresyl phosphate (TCP), trixylenyl phosphate, tripropylphenyl ,phosphate and tributylphenyl phosphate. And examples of an alkyl phosphate include tributyl phosphate (TBP) and tri-2-ethylhexyl phosphate (TOP).

The chlorofluorocarbons have a structure such that hydrogen atoms of n-paraffin are replaced by fluorine atoms and chlorine atoms, and can be produced by polymerizing chlorotrifluoroethylene in a low polymerization degree as shown in the following reaction scheme:

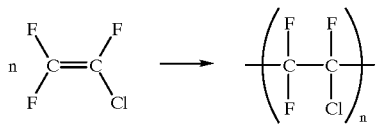

The chlorofluorocarbon produced has a viscosity depending on the polymerization degree, and the viscosity can be varied over a wide range.

Examples of a fluoroester usable in the present invention include sebacic acid esters of $C_7$ perfluoroalcohols, pyromellitic acid esters of perfluoroalcohols and camphoric acid esters of perfluoroalcohols.

The perfluoroalkyl ethers are generally represented by the following formula (VII) or (VIII):

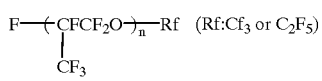
(VII)

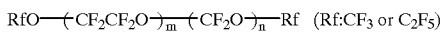
(VIII)

It is possible to produce perfluoroalkyl ethers having from low to high viscosity by changing the polymerization degree.

From the viewpoints of consistency and dispensation suitability required for thermally conductive grease, it is desirable that the liquid hydrocarbons and/or fluorinated hydrocarbon oil used in the present invention have their viscosity in the range of 50 to 500,000 cs, especially 100 to 100,000 cs, at 25° C.

The metallic aluminum powder as Component (B) in the present invention may have any of shapes, including granular, globular and acicular shapes, so far as it has an average particle size of from 0.5 to 50 $\mu$m.

The aluminum powder can be produced by pulverizing molten aluminum using an atomization method, a granulation method wherein molten aluminum is dropped into water to be scattered and solidified, a method wherein molten aluminum is dropped onto an outwardly flowing volatile coolant film formed across the surface of a rapidly rotating disc, or a vaporization method, or by reducing aluminum foil or granules to flakes by grinding with a ball mill or by stamping.

Most of industrial materials are atomized powder, granulated powder and flaked powder, and such powder is sieved by, e.g., a cyclone or screen process in order to obtain the desired particle size fraction. As for the general properties of aluminum powder, the specific gravity at 20° C. is 2.71, the melting point is 657° C., the Brinell hardness is 17, and the thermal conductivity is 204 W/mK in theory.

In the present invention, the aluminum powder having an average particle size of 0.5–50 $\mu$m is employed. When the aluminum powder has an average particle size smaller than 0.5 $\mu$m, the thickening effect thereof is so great that the grease obtained is low in consistency (namely hard and poor in dispensation suitability); while, when the average particle size is greater than 50 $\mu$m, the resulting grease is poor in uniformity and stability, and that suffers serious separation of the base oil (in other words, a high degree of oil separation). Therefore, satisfactory grease cannot be obtained so. far as the aluminum powder used has an average particle size beyond the limits specified above. On the other hand, the heat conducting ability of aluminum powder can be further heightened by blending fine powder having an average particle size of 0.5–5 $\mu$m with coarse powder having an average particle size of 10–40 $\mu$m. In this case, the suitable ratio of the fine powder to the coarse powder is from 9/1 to 1/9 by weight.

Any of commercially produced metallic aluminum powders, e.g., the products of Toyo Aluminum Co., Ltd., Yamaishi Metal Co., Ltd., Urushi Alumi Co., Ltd., Nitto Atomize Industry Co., Ltd., Seiwa Kogyo Co., Ltd., Yamato Metal Co., Ltd., Nakatsuka Metal Co., Ltd. and Asahi Metal Smelting Co., Ltd., may be used in the present invention.

As metallic aluminum powder has high activity, it is subject to not only aerial oxidation but also other reactions with water, acid and alkali. Therefore, the powder surface may be protected by treatment with an organosilane represented by formula $R^2_b SiY_{4-b}$ or the partial hydrolysis-condensation products thereof. In the foregoing formula, $R^2$ represents a hydrocarbon group containing 1 to 20 carbon atoms or a group obtained by substituting halogen atom(s) for part or all of the hydrogen atoms therein, Y represents a hydrolyzable group, and b is an integer of 1 to 3.

Specifically, the hydrocarbon group represented by $R^2$ is an alkyl group, a cycloalkyl group, an alkenyl group, an aryl group or an aralkyl group. Examples of such an alkyl group include methyl, ethyl, propyl, hexyl, octyl, decyl, dodecyl, tetradecyl, hexadecyl and octadecyl groups; examples of such a cycloalkyl group include cyclopentyl and cyclohexyl groups; examples of such an alkenyl group include vinyl and allyl groups; examples of such an aryl group include phenyl and tolyl groups; examples of an aralkyl group include 2-phenylethyl and 2-methyl-2-phenylethyl; and examples of a substituted hydrocarbon group include 3,3,3-trifluoropropyl, 2-(perfluorobutyl)ethyl, 2-(perfluorooctyl)ethyl and p-chloro-phenyl groups.

As for "b", the integer of 1 is preferred in particular.

The hydrolyzable group represented by Y is a hydroxyl group or a functional group containing 1 to 6 carbon atoms selected from alkoxy groups, acyloxy groups or alkenyloxy groups, with examples including methoxy, ethoxy, propoxy, butoxy, acetoxy and propenoxy groups. Of these groups, hydroxyl and alkoxy groups are preferred in particular.

It is desirable for such a surface treatment agent to be used in a proportion of 0.01–5.0 parts by weight per 100 parts by weight of metallic aluminum powder. When the proportion is less than 0.01 parts by weight, the treatment effect cannot be expected; while, when it is increased beyond 5.0 parts by weight, the treatment comes to produce adverse effect upon the resulting grease because it increases the amount of volatile matter.

Although excellent thermal conductive grease can be prepared using Component (A) and Component (B) alone, or using Component (A) and Component (B) which has undergone the surface treatment with an organosilane represented by formula $R^2_b SiY_{4-b}$ or its partial hydrolysis-condensation product, it is desirable from the viewpoint of further heightening the thermal conductivity that zinc oxide powder and/or boron nitride powder be added as Component (C) to the aforementioned Components (A) and (B).

The zinc oxide used as Component (C) in the present invention is a white powder having a hexagonal or wurtzite crystal structure, which is generally referred to as "Zinc White". Such a zinc oxide powder can be prepared using known methods. For instance, one known method is an indirect method in which the zinc vapor generally produced by heating metallic zinc to 1,000° C. is oxidized with hot air, and another known method is a direct method wherein the zinc oxide obtained by roasting zinc ore is reduced by coal or the like and the zinc vapor produced is oxidized with hot air, or wherein the slag obtained by the leaching of zinc ore with sulfuric acid is admixed with coke, heated in an electric furnace and the zinc vapor produced thereby is oxidized with hot air.

The zinc oxide produced using any of the foregoing methods is cooled by passing through an air condenser equipped with a blower, and fractionated according to the grain size. As still another production method of zinc oxide, there is known a wet method in which a zinc salt solution is admixed with an alkali carbonate solution to precipitate zinc hydroxycarbonate and the zinc hydroxycarbonate obtained is roasted. The zinc oxide powders prepared using those methods are defined in the Japanese Industrial Standards, JIS K1410 and K5102, and American standards, ASTM-D79.

In the present invention, the zinc oxide powders produced by any of the aforementioned methods can be used alone, or the mixture of zinc oxide powders produced by different methods may be used.

In general the zinc oxide powder is used not only as a vulcanization accelerator for rubber but also in the fields of coating color, ceramics, enameled ware, glass, ferrite, cosmetics and medicines. Further, it is known to use a zinc oxide powder as a thermal conductivity providing filler in a thermally conductive grease [Japanese Tokkai Sho 51-55870, Sho 54-116055, Sho 55-45770, Sho 56-28264, Sho 61-157587, Hei 2-212556 (U.S. Pat. No. 5,221,339), Hei 3-162493 (U.S. Pat. No. 5,100,568) and Hei 4-202496].

The average particle size of a zinc oxide powder which can be used in the present invention is in a wide range of 0.2 to 5 μm. In view of the dispersibility in a base oil and the relation with aluminum powder used in combination, however, it is desirable for the zinc oxide powder to have an average particle size of 0.3 to 4 μm, particularly 0.3 to 3 μm. By adjusting the particle size to such a range, the oil separation degree of the thermal conductive grease obtained can be lowered to 0.01% or below.

The boron nitride powder usable in the present invention is a hexagonal boron nitride powder having a hexagonal network laminate structure similar to that of graphite, which can be prepared by heating boric acid or a borate together with a nitrogen compound, such as a nitrogen-containing organic compound or ammonia. The boron nitride of hexagonal system has characteristics such that it retains high lubricity even in a high temperature range, has high thermal conductivity as well as high electrical insulating capacity, and further is chemically stable and hardly wetted with fused metal or glass. Accordingly, it is used as an electrical insulating filler having high thermal conductivity, a solid lubricant, a filler for modification of resins, or the like.

The boron nitride powder having a crystal structure of hexagonal system is white in appearance, has an average particle size of 1 to 10 μm, and is generally soft.

The boron nitride powder which can be used in the present invention has its average particle size in a wide range of 1 to 10 μm. In viewing the dispersibility in a base oil and the prevention of oil separation, however, it is desirable for the powder used in the present invention to have the average particle size in the range of 1 to 5 μm.

In order to achieve a high thermal conductivity aimed at by the present invention, it is required to increase the filling rate of an aluminum powder as Component (B) before every filler else. In raising the filling rate of an aluminum powder without damaging grease characteristics, the shape, size and size distribution of filler particles have a very important role. Increase in the filling rate tends to render the grease obtained highly viscous, and thereby to spoil the dispensation suitability of the grease.

The term "dispensation suitability" as used herein indicates the ease of the work in coating a grease on a substrate. When the grease has an inferior dispensation suitability, the efficiency in coating work using a cylinder-form apparatus equipped with a grease extruding means is reduced, and further it becomes difficult to form a thin coating of the grease on a substrate. Therefore, the shape and the size distribution as well as the average size of filler particles constitutes a very important factor in achieving a high filling rate while securing a dispensation suitability.

In the present invention, it is required for Component (B) to be used in a proportion of 500–1,200 parts by weight per 100 parts by weight of Component (A). When the proportion of filler used as component B is less than 500 parts by weight, the resulting grease cannot acquire high thermal conductivity as the main object of the present invention; while, when it is more than 1,200 parts by weight, the grease obtained is so hard (small in consistency) that it cannot be dispensed or comes to have poor extensibility and uniformity.

In the case of using the combination of Component (B) and Component (C), it is desirable that the ratio of Component (C) to the sum of Component (B) and (C) be not higher than 0.5 by weight. When the ratio is increased beyond 0.5, the high thermal conductivity aimed at by the present invention cannot be achieved, because the thermal conductivity of Component (C) is 20–60 W/mK in theory although that of Component (B) is 204 W/mK in theory.

A great feature of the present thermal conductive grease is that, although the filler(s) used in the present grease are soft fillers, namely Component (B) has Brinell hardness of 17, zinc white as Component (C) has Mohs' hardness of 4–5 and hexagonal boron nitrite as Component (C) has Mohs' hardness of 2, the thermal conductivity conferred thereby upon the grease is equivalent or superior to the high thermal conductivity achieved by the incorporation of conventionally used fillers having high Mohs' hardness, such as AlN, Diamond and SiC. Owing to the use of soft fillers as mentioned above, the present thermal conductive grease can be applied to semiconductor materials without causing damage thereto.

In preparing a thermal conductive silicone composition according to the present invention, the Components (A) and (B), or the Components (A), (B) and (C) as mentioned above are mixed together by means of a mixing machine, e.g., TRIMIX, TWINMIX or PLANETARY MIXER (which are the trade names of mixers made by INOUE MFG., INC.), ULTRA MIXER (which is the trade name of a mixer made by MIZUHO INDUSTRIAL CO., LTD.) or HIVISDISPERMIX (which is the trade name of a mixer made by TOKUSHU KIKA KOGYO CO., LTD.).

Therein, organoalkoxysilanes, antioxidants and other additives may further be admixed with the forgoing Components, if needed. Furthermore, the mixing may be carried out while heating up to a temperature of 50–150° C., if desired. In order to render the thus prepared mixture homogeneous, it is desirable that the mixture be subjected to a kneading operation. Examples of a kneader usable for this operation include a three-rod roll kneader, a colloid mill and a sand grinder. of these kneaders, a three-rod roll kneader is used to advantage.

Similarly to conventional thermal conductive grease, the present thermal conductive grease, as shown in FIG. 1, can be put between heat-generating electronic parts 2, such as CPU, and a heat-dissipating member 4, such as a fin-attached heat dissipator which is increased in heat-dissipating effect due to its extended surface area, thereby forming an integrated semiconductor device. In particular, when the present grease is applied to heat-generating parts (e.g., CPU) having the silicon surface left as it is uncovered on the side of a heat dissipator 4 with the intention of efficiently dissipating the heat from heat-generating elements of an integrated circuit, the semiconductor device formed can have higher performance than ever, because the present grease is more instrumental in preventing a performance drop due to temperature rise and causes no damage to the silicon surface.

The present heat-reducing grease composition is held between a heat dissipator and heat-generating electronic parts (semiconductor element) and pressed by tightening these members with clamps. The suitable thickness of the heat-reducing grease composition held between the heat-generating electronic parts and the heat dissipator is from 50 to 500 $\mu$m, particularly from 100 to 200 $\mu$m. This is because there is a fear that, when the thickness is smaller than 50 $\mu$m, spaces are formed between the heat-generating electronic parts and the heat dissipator due to the pressure difference depending on the location; while, when it is greater than 500 $\mu$m, the heat-reducing effect is lowered by an increase in heat resistance in proportion to thickness.

The present invention will now be illustrated in greater detail by reference to the following examples. However, the invention should not be construed as being limited to these examples. Unless otherwise noted, all "parts" and "%" described below are by weight.

The entire disclosure of all applications, patents and publications, cited above and below, and of corresponding Japanese application No. Hei 10-235731, filed Aug. 21, 1998, is hereby incorporated by reference.

Additionally, The consistency values and the oil separation degrees set forth in Tables 2 and 3 are those measured using the testing method defined in JIS K-2220, and the thermal conductivity of each grease composition is measured at 25° C. with a quick thermal conductivity meter, Model QTM-500 (trade name, made by KYOTO ELECTRONICS MFG. CO., LTD.).

EXAMPLES 1–12

Liquid silicones A-1 to A-5 represented by the following formula (IX) and having viscosity set forth in Table 1, and a hydrocarbon A-6 and a fluorohydrocarbon A-7 shown below were each used as base oil (Component (A)) in the amount of 100 parts.

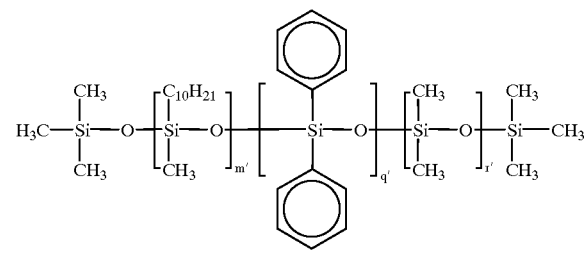

(IX)

TABLE 1

| Symbol of Base Oil | Viscosity (cs) at 25° C. | Average Polymerization Degree | | |
|---|---|---|---|---|
| | | m' | q' | r' |
| A-1 | 450 | 20 | 0 | 25 |
| A-2 | 1,000 | 80 | 0 | 100 |
| A-3 | 500 | 0 | 0 | 240 |
| A-4 | 400 | 0 | 3 | 9 |
| A-5 | 10,000 | 0 | 0 | 800 |

| | Viscosity (cs) at 40° C. | Specific Gravity |
|---|---|---|
| A-6* | 1,400 | 0.856 |
| A-7** | 200 | 1.89 |

*ETHYLFLO 180, trade name, a product of U.S. ETHYL Co., having the following structural formula;

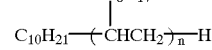

**DEMNUM S-200, trade name, a product of DAIKIN KOGYO CO., LTD., having the following structural formula;

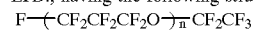

Thermally conductive grease compositions according to the present invention were each prepared as follows; Fillers as Component (B) and Component (C), the species and average particle sizes of which are set forth in Table 2, were weighed out in their respective amounts as set forth in Table 2, and added to each of the base oils specified above. Then, these three components were thoroughly mixed for 20 minutes by means of a planetary mixer, and further subjected to a kneading process for three times by means of a three-rod roll.

D-1: $C_{10}H_{21}Si(OCH_3)_3$

D-2: $C_{12}H_{25}Si(OCH_3)_3$

D-3: $C_6H_{13}Si(OCH_3)_3$

D-4: $C_{10}H_{21}Si(CH_3)(OCH_3)_2$

D-5: $CH_3Si(OCH_3)_3$

TABLE 2

| | Component (A) (100 pts. wt.) | | Component (B) | | | | Component (C) | | |
|---|---|---|---|---|---|---|---|---|---|
| | Species | Viscosity at 25° C. (cs) | Average particle size (μm) | Amount added (pts. wt.) | Treatment agent Species | Amount added (pts. wt.) | Species | Average particle size (μm) | Amount added (pts. wt.) |
| Example 1 | A-1 | 450 | 5 | 745 | — | — | — | — | — |
| Example 2 | A-1 | 450 | 2 15 | 372 372 | — | — | C-1 | 0.3 | 219 |
| Example 3 | A-2 | 1,000 | 1 20 | 331 442 | D-1 | 7.73 | C-1 | 0.5 | 228 |
| Example 4 | A-3 | 500 | 30 | 773 | — | — | C-1 | 5.0 | 228 |
| Example 5 | A-4 | 400 | 10 | 500 | D-2 | 2.5 | C-2 | 1.0 | 233 |
| Example 6 | A-5 | 10,000 | 0.5 40 | 264 364 | D-3 | 6.3 | C-2 | 3.0 | 182 |
| Example 7 | A-1 | 450 | 2 15 | 423 423 | D-4 | 0.85 | C-2 | 3.0 | 54 |
| Example 8 | A-6 | 1,400 | 10 | 430 | — | — | C-1 | 2.0 | 184 |
| Example 9 | A-7 | 200 | 15 | 540 | D-5 | 1.08 | C-1 | 3.0 | 360 |
| Example 10 | A-2 | 1,000 | 2 15 | 547 547 | D-1 | 22 | C-1 | 0.3 | 322 |
| Example 11 | A-1 | 450 | 2 15 | 319 426 | D-1 | 37 | C-1 | 0.5 | 219 |
| Example 12 | A-2 | 1,000 | 3 15 | 368 426 | D-2 | 3.18 | C-2 | 5.0 | 170 |

| | $\dfrac{(C)}{((B)+(C))}$ | Consistency (unworked penetration) | Degree of oil separation (%) | Thermal Conductivity W/mK |
|---|---|---|---|---|
| Example 1 | — | 230 | 0.01 | 3.3 |
| Example 2 | 0.227 | 283 | 0 | 3.8 |
| Example 3 | 0.227 | 250 | 0 | 4.2 |
| Example 4 | 0.227 | 290 | 0.1 | 3.6 |
| Example 5 | 0.35 | 245 | 0.1 | 3.5 |
| Example 6 | 0.225 | 220 | 0 | 3.7 |
| Example 7 | 0.06 | 230 | 0 | 3.8 |
| Example 8 | 0.30 | 240 | 0.1 | 3.4 |
| Example 9 | 0.40 | 230 | 0 | 3.5 |
| Example 10 | 0.227 | 235 | 0 | 4.1 |
| Example 11 | 0.227 | 280 | 0 | 4.2 |
| Example 12 | 0.176 | 230 | 0 | 4.2 |

B: Metallic aluminum powder
C-1: Zinc oxide powder
C-2: Boron nitride powder

The thermally conductive composition samples thus prepared were each examined for consistency and oil separation degree in accordance with JIS-K-2220 with the intention of using them as grease, and further the thermal conductivities thereof were measured with a hot-wire thermal conductivity meter, Model QTM-500 (trade name, made by KYOTO ELECTRONICS MFG. CO., LTD.). The results obtained are s-shown in Table 2.

Additionally, the oil separation degree shown in Table 2 was the value determined after each grease composition was allowed to stand for 24 hours under the temperature of 150° C., and the treatment agent (D) set forth in Table 2 is an additive used for the surface treatment of metallic aluminum powder as component (B), and the following compounds were each employed as the agent (D):

COMPARATIVE EXAMPLES 1–15

Thermally conductive grease compositions were each prepared in the same manner as in the foregoing Examples, except that the ingredients shown in Table 3 were used in their respective amounts set forth in Table 3.

The consistency, oil separation degree and thermal conductivity of each grease composition prepared above were determined by the same methods as adopted in Examples. The results obtained are shown in Table 3.

TABLE 3

| | Component (A) (100 pts. wt.) | | Component (B) | | | | Component (C) | | |
|---|---|---|---|---|---|---|---|---|---|
| | Species | Viscosity at 25° C. (cs) | Average particle size (μm) | Amount added (pts. wt.) | Treatment agent Species | Treatment agent Amount added (pts. wt.) | Species | Average particle size (μm) | Amount added (pts. wt.) |
| Compar. Ex. 1 | A-1 | 450 | 0.3 | 669 | — | — | — | — | — |
| Compar. Ex. 2 | A-2 | 1,000 | 60 | 510 | D-1 | 2.5 | — | — | — |
| Compar. Ex. 3 | A-1 | 450 | 2 | 800 | — | — | C-1 | 0.3 | 500 |
| Compar. Ex. 4 | A-3 | 500 | 2 | 400 | — | — | — | — | — |
| Compar. Ex. 5 | A-4 | 450 | 5 | 400 | D-2 | 4.0 | C-2 | 0.2 | 900 |
| Compar. Ex. 6 | A-5 | 10,000 | 5 | 300 | — | — | C-1 | 0.5 | 800 |
| Compar. Ex. 7 | A-6 | 1,400 | 0.2 | 700 | D-3 | 0.7 | C-2 | 0.3 | 500 |
| Compar. Ex. 8 | A-7 | 200 | 10 | 300 | D-4 | 3.0 | C-1 | 6.0 | 700 |

| | (C)/((B)+(C)) | Consistency (unworked penetration) | Degree of oil separation (%) | Thermal Conductivity W/mK |
|---|---|---|---|---|
| Compar. Ex. 1 | — | | not grease | |
| Compar. Ex. 2 | — | 163 | 1.0 | 1.0 (rough surface) |
| Compar. Ex. 3 | 0.38 | | not grease | |
| Compar. Ex. 4 | — | 380 | 3.0 | 0.7 |
| Compar. Ex. 5 | 0.69 | | not grease | |
| Compar. Ex. 6 | 0.72 | 180 | 0 | 0.4 |
| Compar. Ex. 7 | 0.41 | | not grease | |
| Compar. Ex. 8 | 0.7 | 200 | 0 | 0.35 |

B: Metallic aluminum powder
C-1: Zinc oxide powder
C-2: Boron nitride powder

As can be seen from Table 2 and Table 3, the grease compositions according to the present invention had their thermal conductivity within the range of 3.30 to 4.20 W/mK. This range of thermal conductivity is materially higher than those of conventional grease and the grease compositions taken as Comparative Examples. Further, the present grease compositions had their consistency on a practically optimal level, and showed satisfactory dispensation suitability.

What is claimed is:

1. A thermally conductive grease composition comprising (A) 100 parts by weight of a base oil wherein said base oil is at least one oil of a liquid silicone, a liquid hydrocarbon or a fluorinated hydrocarbon oil wherein said fluorinated hydrocarbon oil is at least one oil selected from a polychlorotrifluoroethylene, a fluoroester or a polyperfluoroalkyl ether, (B) 500 to 1,200 parts by weight of metallic aluminum powder having the average particle size in the range of 0.5–50 μm and (C) zinc oxide powder having an average particle size in the range of 0.2–5 μm or hexagonal boron nitride powder having an average particle size in the range of 1–5 μm, wherein said aluminum powder is a 9:1 to 1:9 by weight mixture of fine metallic aluminum powder having an average particle size of 0.5 to 5 μm and coarse metallic aluminum powder having an average particle size of 10 to 40 μm, and said Components (B) and (C) are contained in a total amount of 900–1416 parts by weight per 100 parts by weight of said base oil and in proportion satisfying a relation that the (C)/[(B)+(C)] ratio is not greater than 0.5 by weight.

2. A thermally conductive grease composition according to claim 1 having a thermal conductivity of at least 3.8 W/mk.

3. A thermally conductive grease composition according to claim 1 having a thermal conductivity of 3.8–4.2 W/mk.

4. A thermally conductive grease composition according to claim 1, wherein the viscosity of said liquid silicone is from 50 to 500,000 cs at 25° C.

5. A thermally conductive grease composition according to claim 1, wherein said metallic aluminum powder has a surface treated with an organosilane represented by $R^2_b SiY_{4-b}$ or partial hydrolysis-condensation products thereof, wherein $R^2$ is a hydrocarbon group containing 1 to 20 carbon atoms or a group formed by substituting halogen atoms for part or all of hydrogen atoms in the hydrocarbon group, Y is a hydrolyzable group, b is an integer of 1 to 3.

6. A thermally conductive grease composition according to claim 1, wherein said liquid silicone is an organopolysiloxane represented by formula $R^1_a SiO_{(4-a)/2}$ wherein each $R^1$ group is a hydrogen atom, a hydroxyl group, or an unsubstituted or a substituted monovalent hydrocarbon group containing 1 to 30 carbon atoms, an amino group-containing a hydrocarbon group or epoxy group-containing a hydrocarbon group, and "a" is a number of 1.8–2.3

7. A thermally conductive grease composition according to claim 6, wherein said unsubstituted or substituted monovalent hydrocarbon group comprises an alkyl group, a cycloalkyl group, an alkenyl group, an aryl group or a group formed by substituting a halogen atom, cyano group or hydroxyl group for at least one of the hydrogen atoms attached to carbon atoms in the groups recited above.

8. A thermally conductive grease composition according to claim 6, wherein the group as $R^1$ is a methyl group, a phenyl group or an alkyl group containing 6 to 14 carbon atoms.

9. A thermally conductive grease composition according to claim 1, wherein the base oil is a mixture of a liquid hydrocarbon and a fluorinated hydrocarbon oil.

10. A thermally conductive grease composition according to claim 9, wherein said liquid hydrocarbon is at least one oil selected from a paraffin oil, a naphthene oil, an alpha-olefin oligomer, a polybutene, a polyalkylene glycol, a diester, a polyol ether or a phosphate.

11. A thermally conductive grease composition according to claim 9, wherein the viscosity of the liquid hydrocarbon is from 50 to 500,000 cs at 25° C.

12. A thermally conductive grease composition according to claim 9, wherein said fluorinated hydrocarbon oil is at least one oil selected from a polychlorotrifluoroethylene, a fluoroester or a polyperfluoroalkyl ether.

13. A thermally conductive grease composition according to claim 12, wherein the fluoroester is a sebacic acid ester of a $C_7$ perfluoroalcohol, a pyromellitic acid ester of a perfluoroalcohol, or a camphoric acid ester of a perfluoroalcohol; and the perfluoroalkyl ether is represented by the formula VII or VIII:

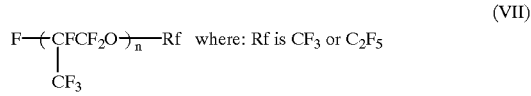

(VII)

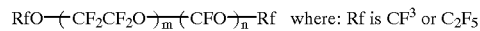

(VII)

14. A thermally conductive grease composition having a thermal conductivity of at least 3.8 W/mk comprising (A) 100 parts by weight of a base oil and (B) 500 to 1,200 parts by weight of metallic aluminum powder having an average particle size in the range of 0.5–50 μm wherein said aluminum powder is a 9:1 to 1:9 by weight mixture of fine metallic aluminum powder having an average particle size of 10 to 40 μm; wherein said base oil is at least one oil of a liquid silicone, a liquid hydrocarbon or a fluorinated hydrocarbon oil wherein said fluorinated hydrocarbon oil is at least one oil selected from a polychlorotrifluoroethylene, a fluoroester or a polyperfluoroalkyl ether.

15. A semiconductor device holding a thermally conductive grease composition having a thermal conductivity of at least 3.8 W/mk between a semiconductor element and a dissipator to remove the heat the semiconductor element generates, wherein the thermally conductive grease composition comprises (A) 100 parts by weight of a base oil wherein said base oil is at least one oil of a liquid silicone, a liquid hydrocarbon or a fluorinated hydrocarbon oil wherein said fluorinated hydrocarbon oil is at least one oil selected from a polychlorotrifluoroethylene, a fluoroester or a polyperfluoroalkyl ether and (B) 500 to 1,200 parts by weight of metallic aluminum powder having an average particle size in the range of 0.5–50 μm and forms a layer having a thickness of 50 to 500 μm wherein said aluminum powder is a 9:1 to 1:9 by weight mixture of fine metallic aluminum powder having an average particle size of 0.5 to 5 μm and coarse metallic aluminum powder having an average particle size of 10 to 40 μm.

16. A semiconductor device according to claim 15, wherein the thermally conductive grease composition is spread over the bare area of the silicon surface of semiconductor element on the dissipator side.

* * * * *